US008878566B2

(12) United States Patent
Nakaya

(10) Patent No.: US 8,878,566 B2
(45) Date of Patent: Nov. 4, 2014

(54) RECONFIGURABLE CIRCUIT

(75) Inventor: Shogo Nakaya, Tokyo (JP)

(73) Assignee: NEC Corporation, Tokyo (JP)

( * ) Notice: Subject to any disclaimer, the term of this patent is extended or adjusted under 35 U.S.C. 154(b) by 62 days.

(21) Appl. No.: 13/821,892

(22) PCT Filed: Aug. 18, 2011

(86) PCT No.: PCT/JP2011/069099
§ 371 (c)(1),
(2), (4) Date: Mar. 8, 2013

(87) PCT Pub. No.: WO2012/032937
PCT Pub. Date: Mar. 15, 2012

(65) Prior Publication Data
US 2013/0176051 A1 Jul. 11, 2013

(30) Foreign Application Priority Data
Sep. 8, 2010 (JP) ................................ 2010-200433

(51) Int. Cl.
 H03K 19/173 (2006.01)
 H03K 19/177 (2006.01)
(52) U.S. Cl.
 CPC ............................. *H03K 19/17736* (2013.01)
 USPC ................................ 326/38; 326/41; 326/47
(58) Field of Classification Search
 CPC ................. H03K 19/17704; H03K 19/17748;
 H03K 19/17736; H03K 19/17728
 USPC .............................................. 326/37–41, 47
 See application file for complete search history.

(56) References Cited

U.S. PATENT DOCUMENTS 6,590,419 B1 * 7/2003 Betz et al. ........................ 326/47
7,463,055 B2 * 12/2008 Ciccarelli et al. ............... 326/38
7,724,031 B2 * 5/2010 Cashman ......................... 326/41

FOREIGN PATENT DOCUMENTS

JP 2002076883 A 3/2002
(Continued)

OTHER PUBLICATIONS

The international search report for PCT/JP2011/069099 mailed on Dec. 6, 2011.

(Continued)

Primary Examiner — Jason M Crawford
(74) Attorney, Agent, or Firm — Sughrue Mion, PLLC

(57) ABSTRACT

A reconfigurable circuit of the present invention is characterized in being provided with: a first programmable wiring group, which is disposed in the first direction; a second programmable wiring group, which is disposed in the second direction that intersects the first direction; a first switch element array, which connects the programmable wiring groups to each other at the intersecting points of the first programmable wiring group and the branch line group of a functional block input wiring group or at the intersecting points of the branch line group of the first programmable wiring group and the functional block input wiring group; a second switch element array, which connects the programmable wiring groups to each other at the intersecting points of the first programmable wiring group and functional block output wiring; and a third switch element array, which connects the programmable wiring groups to each other at the intersecting points of the second programmable wiring group and the first programmable wiring group. The reconfigurable circuit is also characterized in being provided with a fourth switch element array, which connects the programmable wiring groups to each other at the intersecting points of the second programmable wiring group and the functional block input wiring group, and/or a fifth switch element array, which connects the programmable wiring groups to each other at the intersecting points of the second programmable wiring group and the branch lines of the functional block output wiring.

10 Claims, 15 Drawing Sheets

(56) References Cited

FOREIGN PATENT DOCUMENTS

| JP | 2003511947 A | 3/2003 |
| JP | 2005101535 A | 4/2005 |
| JP | 2006020329 A | 1/2006 |

OTHER PUBLICATIONS

The written opinion for PCT/JP2011/069099.

* cited by examiner

| INPUT TERMINAL | I0 | I1 | I2 | LOGICAL FUNCTION |
|---|---|---|---|---|
| INPUT SIGNAL | 0 | I1 | I2 | I1 AND I2 |
| | 1 | I1 | I2 | I1 OR (NOT I2) |
| | I0 | 1 | I2 | I1 OR I2 |
| | I0 | 0 | I2 | I0 NAND I2 |
| | 0 | 1 | I2 | I2 |
| | 1 | 0 | I2 | NOT I2 |
| | I0 | X | 0 | I0 |
| | X | I1 | 1 | I1 |
| | I0 | I1 | I2 | MUX(I0, I1, I2) |

2

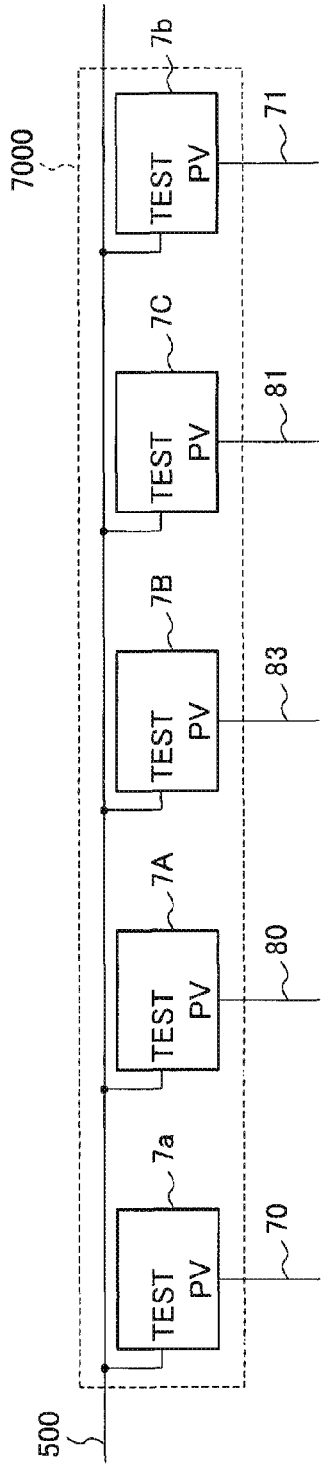
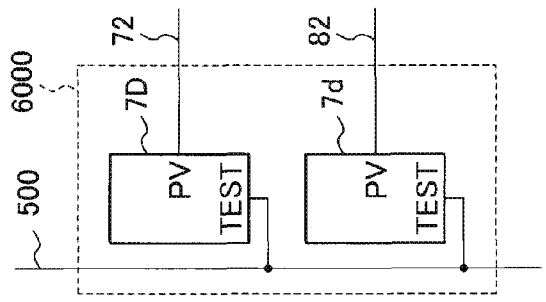
Fig. 13A
Fig. 13B

Fig. 14
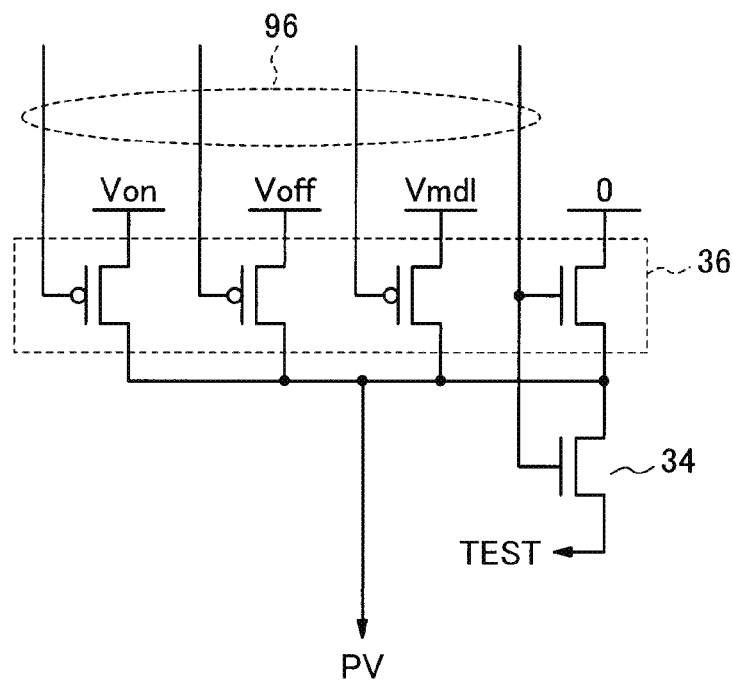
Fig. 15A  Fig. 15B  Fig. 15C
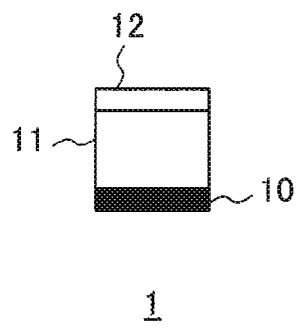 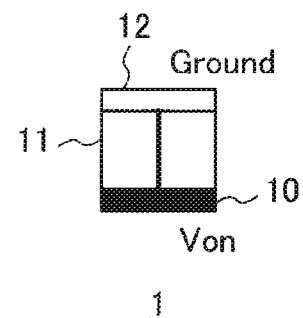 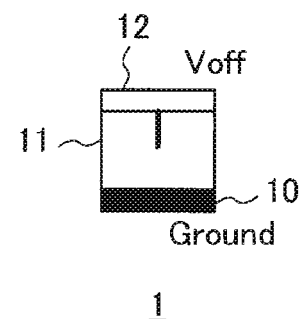

RECONFIGURABLE CIRCUIT

This application is a National Stage Entry of PCT/JP2011/069099 filed Aug. 18, 2011, which claims priority from Japanese Patent Application 2010-200433 filed Sep. 8, 2010, the contents of all of which are incorporated herein by reference, in their entirety.

TECHNICAL FIELD

The present invention relates to reconfigurable circuits using a rewritable nonvolatile switching element.

BACKGROUND ART

A nonvolatile switching element has been developed recently, which can be re-written with a small area (hereinafter, referred to as a rewritable nonvolatile switching element).

As shown in FIG. 15A, a rewritable nonvolatile switching element 1 includes an anode 10 of a first electrode, a cathode 12 of a second electrode, and an ion conductor 11 sandwiched between the two electrodes.

The anode 10 is an electrode which supplies a metal ion to the ion conductor 11 and is mainly composed of copper. The cathode 12 is an electrode which does not supply a metal ion to the ion conductor 11 and platinum or the like is utilized. The ion conductor 11 has such a nature as to move the metal ion supplied from the anode 10 and tantalum oxide or the like is utilized.

FIG. 15B shows the state that the rewritable nonvolatile switching element 1 is ON, that is, the conduction state between these two electrodes. These two electrodes become the conduction state by applying a voltage Von to the anode 10 to and connecting the cathode 12 to the ground.

FIG. 15C shows the state that the rewritable nonvolatile switching element 1 is OFF, that is, the cut-off state between these two electrodes. These two electrodes become the cut-off state by connecting the anode 10 to the ground and applying a voltage Voff to the cathode 12.

Turning the rewritable nonvolatile switching element 1 ON or OFF is called programming. The ON state and the OFF state of the rewritable nonvolatile switching element 1 are held even if the power supply is cut.

A programmable cell 5 is disclosed in the Patent Literature 1, which uses the rewritable nonvolatile switching element 1 as shown in FIG. 16. A horizontal programmable wiring group 100 intersects a vertical programmable wiring group 200, an input wiring group 310 of a function block 2, and an output wiring 400 of a function block 2 at an intersecting area 5000 of these wiring groups. An intersecting point of each wiring is coupled with each other by a rewritable nonvolatile switching element 1A. The adjacent horizontal programmable wiring groups 100 are coupled with each other by a rewritable nonvolatile switching element 1B and the adjacent vertical programmable wiring groups 200 are coupled with each other by a rewritable nonvolatile switching element 1B.

The rewritable nonvolatile switching element 1A is an element in which a horizontal wiring and a vertical wiring are connected to terminals 14 and 13 of the rewritable nonvolatile switching element 1 as shown in FIG. 17A. The rewritable nonvolatile switching element 1B is an element in which adjacent wirings are connected to the terminals 14 and 13 of the rewritable nonvolatile switching element 1 as shown in FIG. 17B.

CITATION LIST

Patent Literature

Patent Literature 1: Japanese Patent Application Laid-Open Publication No. 2005-101535

DISCLOSURE OF INVENTION

Problem to be Solved by the Invention

However, the circuit using the rewritable nonvolatile switching element described in patent literature 1 has a problem of a lack of routability. In other words, the input wiring group and the output wiring group of the function block do not have a means connecting with the vertical wiring group directly. Therefore, the order for the input wiring and the output wiring to connect with the vertical wiring group, it is necessary to connect via the horizontal wiring group. As a result, the degree of freedom of the wiring connectivity declines.

The object of the present invention is to provide a reconfigurable circuit which solves the above-mentioned problem.

Means for Solving a Problem

A reconfigurable circuit, comprising: a first programmable wiring group disposed in a first direction; a second programmable wiring group disposed in a second direction intersecting the first direction; a first switching element array connecting the first programmable wiring group to branch line group of input line group of a function block at those intersecting points, or connecting branch line group of the first programmable wiring group to the input line group of the function block at those intersecting points; a second switching element array connecting the first programmable wiring group to the output wiring of the function block at those intersecting points; a third switching element array connecting the first programmable wiring group to the second programmable wiring group at those intersecting points; at least one of a fourth switching element array and a fifth switching element is disposed; and the fourth switching element array connects the second programmable wiring group to the input wiring group of the function block at those intersecting points, and the fifth switching element array connects the second programmable wiring group to the branch line of the output wiring of the function block at those intersecting points.

Effect of Invention

According to the reconfigurable circuit by the present invention, it becomes possible to realize a circuit with having high routability.

BRIEF DESCRIPTION OF THE DRAWINGS

FIG. 13A is a block diagram of the first programming block in the eighth exemplary embodiment.

A FIG. 13B is a block diagram of the second programming block in the eighth exemplary embodiment.

FIG. 14 is a circuit diagram of the programming driver 7 in the eighth exemplary embodiment.

FIG. 15A is a diagram showing a structure of the rewritable nonvolatile switching element.

FIG. 15B is a diagram showing a structure of the rewritable nonvolatile switching element.

FIG. 15C is a diagram showing a structure of the rewritable nonvolatile switching element.

DESCRIPTION OF EMBODIMENTS

[First Exemplary Embodiment]
The preferred exemplary embodiment of the present invention will be described below using drawings. Although, technically preferable limitations are added in the embodiments described below to embody the present invention, the scope of the invention is not limited to those embodiments.

Figure 1:
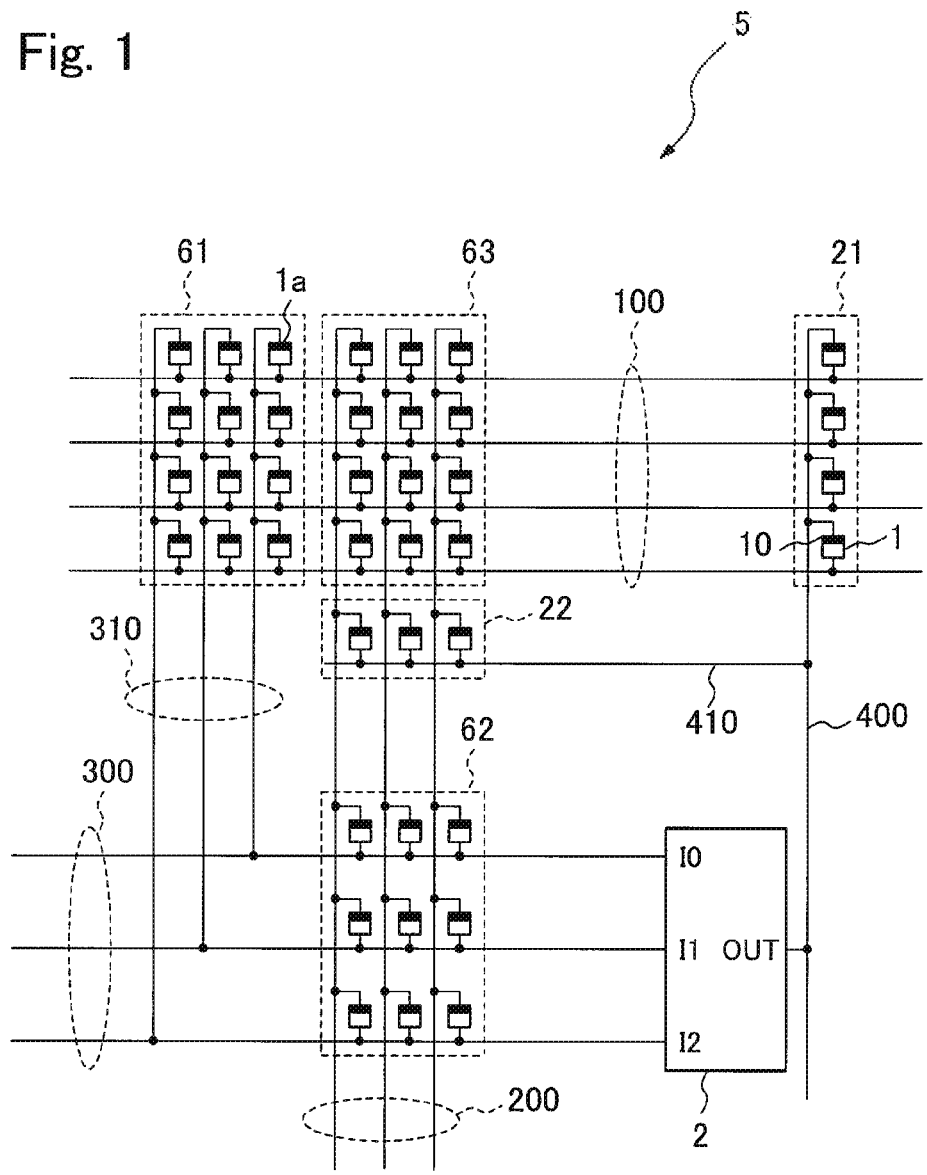
FIG. 1 is a circuit diagram of the programmable cell 5 in the first exemplary embodiment.

[Description of the structure] FIG. 1 is a block diagram of a reconfigurable circuit of an exemplary embodiment of the present invention. The reconfigurable circuit in the present exemplary embodiment includes a plurality of programmable cells 5.

The programmable cell 5 includes a rewritable nonvolatile switching element 1, a function block 2, a first programmable wiring group (a horizontal programmable wiring group 100 in the present exemplary embodiment), a second programmable wiring group (a vertical programmable wiring group 200 in the present exemplary embodiment), input wiring groups 300 and 310, and output wirings 400 and 410.

The output wiring 400 of the function block 2 is programmably connected to the horizontal programmable wiring group 100 via rewritable nonvolatile switching element group 21. On the other hand, an output wiring 410 of the function block 2 is programmably connected to the vertical programmable wiring group 200 via rewritable nonvolatile switching element group 22. The output wiring 410 is a branch line of the output wiring 400.

The input wiring group 310 of the function block 2 is programmably connected to the horizontal programmable wiring group 100 via rewritable nonvolatile switching element group 61. The input wiring group 300 is programmably connected to the vertical programmable wiring group 200 via a rewritable nonvolatile switching element group 62. The input wiring group 310 is branch lines of the grouped input wiring group 300.

The horizontal programmable wiring group 100 and the vertical programmable wiring group 200 are connected via a rewritable nonvolatile switching element group 63.

[Description of the effect] The semiconductor integrated circuit described in the patent literature 1 does not have the means for connecting the input wiring group and the output line of the function block 2 to the vertical wiring group directly, and thus those are connected with each other via the horizontal wiring group. Therefore, there is a problem of a lack of routability.

The programmable cell 5 in the present exemplary embodiment is further provided with the rewritable nonvolatile switching element groups 62 and 22 newly. The rewritable nonvolatile switching element group 62 connects the input wiring group 300 to the vertical programmable wiring group 200. The rewritable nonvolatile switching element group 22 connects the output line 410 to the vertical programmable wiring group 200.

By the above configuration, it is possible in the programmable cell 5 to connect the vertical programmable wiring group 200 to the input lines and the output line of the function block 2 directly. Thus, it is possible to increase the flexibility of wiring design and to realize high routability.

In the present exemplary embodiment, the description has been made for the structure in which both of the rewritable nonvolatile switching element groups 62 and 22 are provided; a structure is also acceptable in which only one of them is provided.

Figure 2:
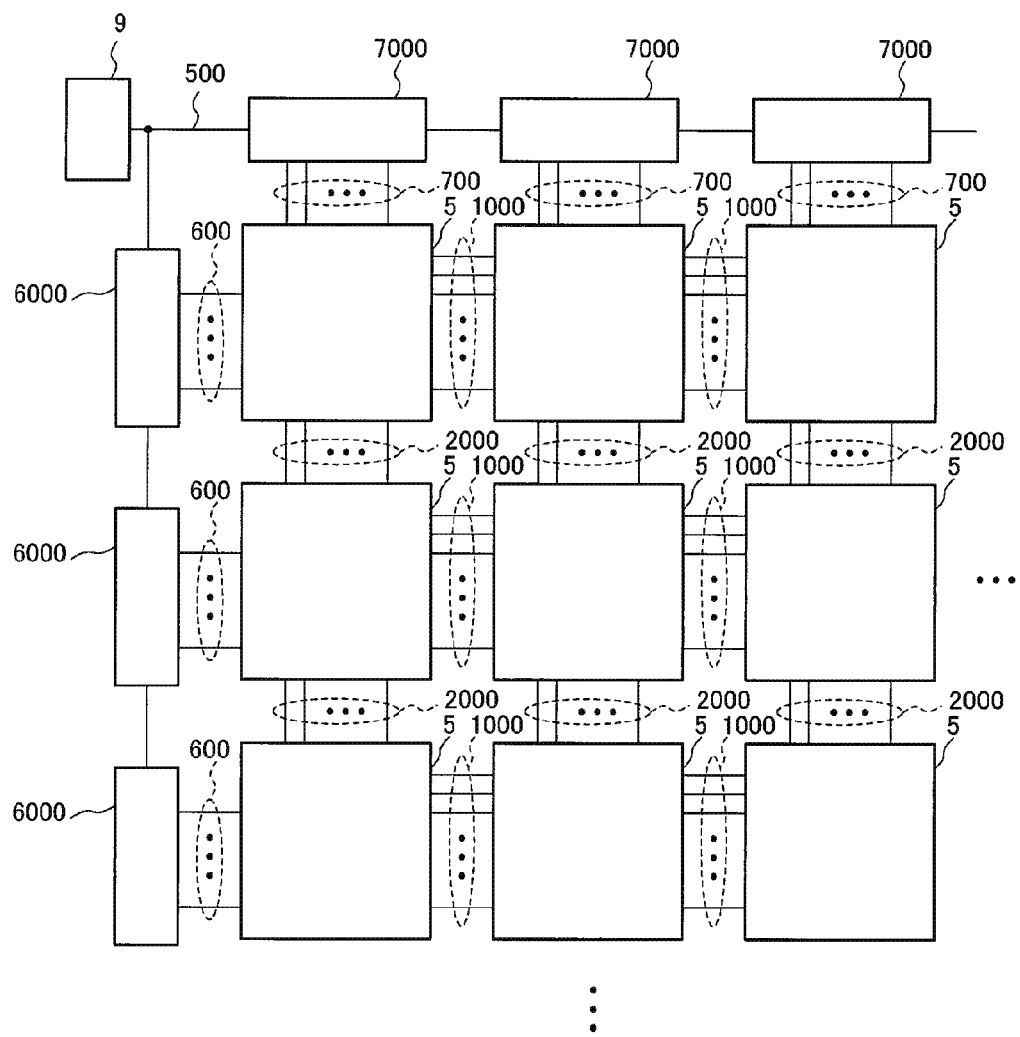
FIG. 2 is a block diagram of the reconfigurable circuit in the second exemplary embodiment.

[Second Exemplary Embodiment]
Concerning the second exemplary embodiment, FIG. 2 is a block diagram showing the structure of a reconfigurable circuit of the present exemplary embodiment.

[Description of the structure] As shown in FIG. 2, a reconfigurable circuit of the present exemplary embodiment includes a horizontal wiring group 1000, a vertical wiring group 2000, a first programming block 7000, and a second programming block 6000. The other structure and connection relationship of the present exemplary embodiment are the same as those of the first exemplary embodiment. In other words, the reconfigurable circuit of the second exemplary embodiment includes the programmable cell 5, the rewritable nonvolatile switching element 1, the function block 2, the horizontal programmable wiring group 100, the vertical programmable wiring group 200, the input wiring groups 300 and 310, and the output wiring groups 400 and 410.

The reconfigurable circuit in the present exemplary embodiment has a plurality of programmable cells 5. The programmable cells 5 are arranged in a matrix in a plane. It is possible for the matrix to have any array size (the number of rows and the number of columns). The programmable cells 5 lying next to each other on right and left are coupled with each other by the horizontal wiring group 1000. The programmable cells 5 lying next to each other on top and bottom are coupled with each other by the vertical wiring group 2000.

The first programming block 7000 is disposed in the end of each column of a matrix of the programmable cell 5. The first programmable cell 7000 is connected to the programmable cell 5 via the first programming wiring group 700.

Similarly, the second programming block 6000 is disposed in the end of each row of a matrix of the programmable cell 5. The second programmable cell 6000 is connected to the programmable cell 5 via the second programming wiring group 600.

The plurality of first programming blocks 7000 and the plurality of second programming blocks 6000 are connected by a state detection line 500, and the state detection line 500 is connected to a programming controller 9.

Figure 3:
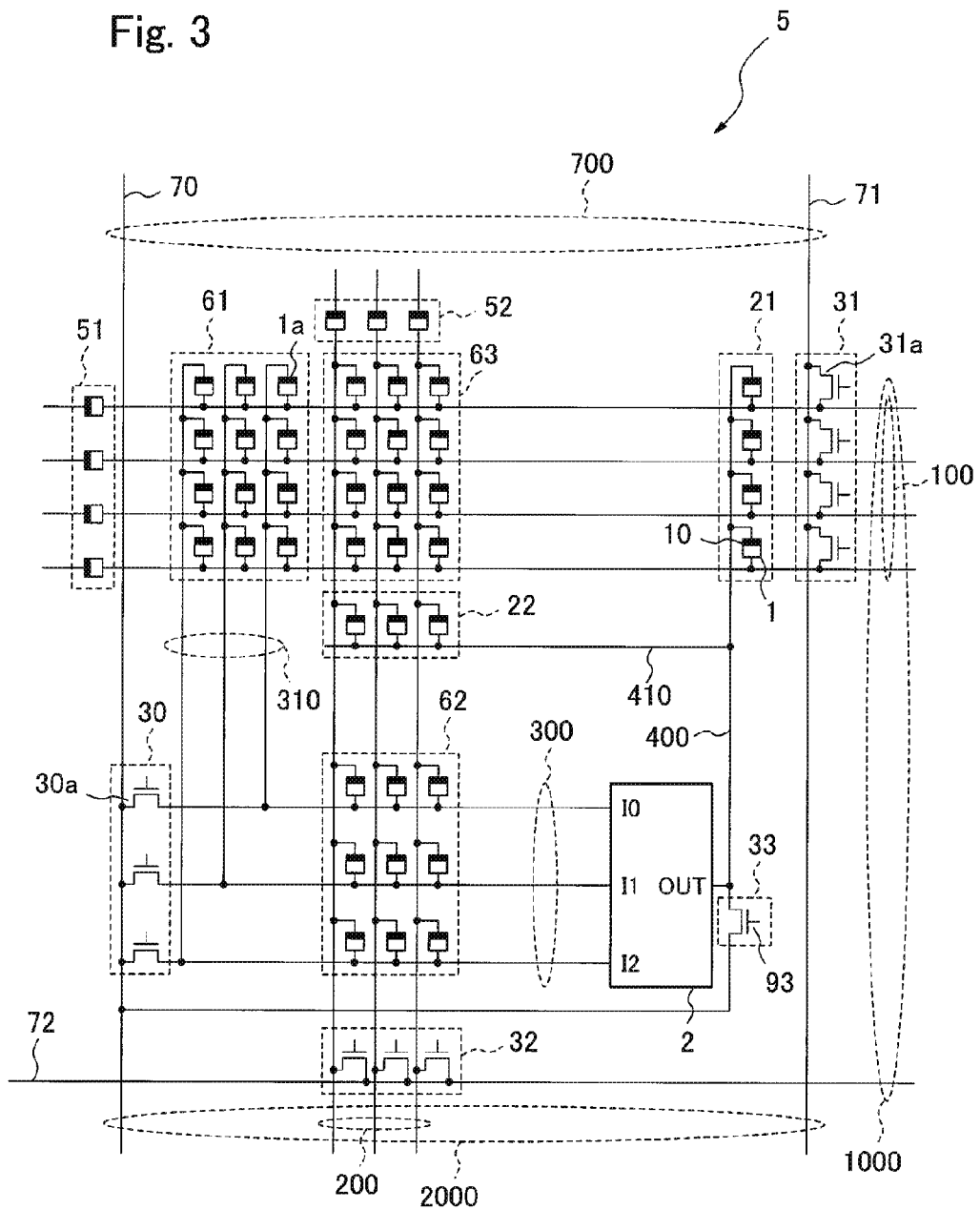
FIG. 3 is a circuit diagram of the programmable cell 5 in the second exemplary embodiment.

As shown in FIG. 3, the programmable cell 5 in the present exemplary embodiment is provided with a horizontal programming transistor group 31, a vertical programming transistor group 32, an input programming transistor group 30, and an output programming transistor 33.

The drain terminal of each transistor of the horizontal programming transistor group 31 is connected to each wiring of the horizontal programmable wiring group 100, respectively. The source terminal of each transistor of the horizontal programming transistor group 31 is connected to a horizontal programming line 71.

The drain terminal of each transistor of the vertical programming transistor group 32 is connected to each wiring of the vertical programmable wiring group 200, respectively. The source terminal of each transistor of the vertical programming transistor group 32 is connected to a vertical programming line 72.

The drain terminal of each transistor of the input programming transistor group 30 is connected to each wiring of the input wiring group 300 of the function block 2, respectively. The source terminal of each transistor of the input programming transistor group 30 is connected to an input programming line 70.

The drain terminal of the output programming transistor 33 is connected to the output wiring 400 of the function block 2. The source terminal of the output programming transistor 33 is connected to the input programming line 70. While the source terminal is connected to the input programming line 70 in FIG. 3, it is not limited to it, it is possible to be connected to another programming line.

The gate terminal of each of programming transistors from 30 to 33 (a gate terminal 93 of the output programming transistor 33, for example) is controlled by the programming controller 9.

The rewritable nonvolatile switching element group 51 connects the horizontal programmable wiring group 100 to the adjacent horizontal programmable wiring group 100 programmably. Similarly, the rewritable nonvolatile switching element group 52 connects the vertical programmable wiring group 200 to the adjacent vertical programmable wiring group 200 programmably.

[Description of the action] Next, a programming example of the rewritable nonvolatile switching element 1 in the present exemplary embodiment will be described.

As shown in FIG. 3, in the case where a rewritable nonvolatile switching element 1a in the rewritable nonvolatile switching element group 61 is programmed to ON, programming transistors 31a and 30a are turned on, and other programming transistors are turned off.

Next, when the input programming line 70 is set at an ON voltage Von and the horizontal programming line 71 is set at 0 V, the rewritable nonvolatile switching element 1a becomes the ON state after the elapse of a certain period of time. To prevent programming by mistake to an unintended rewritable nonvolatile switching element 1, it is desirable to set a non-use programming line at half the voltage of Von for precharge.

Also, to change the rewritable nonvolatile switching element 1a into OFF state, the input programming line 70 should be set at 0 V and the horizontal programming line 71 should be set at Voff of the OFF voltage.

In FIG. 3, each wiring segment of the horizontal programmable wiring group 100 is connected to the vertical programmable wiring group 200 via the rewritable nonvolatile switching element group 63. Each wiring segment of the horizontal programmable wiring group 100 is connected to the input wiring group 310 via the rewritable nonvolatile switching element group 61. If performing programming, it is desirable to set only one rewritable nonvolatile switching element 1 at ON state. In other words, it is possible to prevent an erroneous operation of programming and to perform highly reliable and stable connection by not setting more than one rewritable nonvolatile switching element 1 which are connected to the same wiring at ON state.

In FIG. 3, each wiring segment of the vertical programmable wiring group 200 is connected to the horizontal programmable wiring group 100 via the rewritable nonvolatile switching element group 63. Each wiring segment of the vertical programmable wiring group 200 is connected to the input wiring group 300 via the rewritable nonvolatile switching element group 62. If performing programming, it is desirable to set only one rewritable nonvolatile switching element 1 at ON state. In other words, it is possible to prevent an erroneous operation of programming and to perform highly reliable and stable connection by not setting more than one rewritable nonvolatile switching element 1 which are connected to the same wiring at ON state.

Also, in FIG. 3, each wiring segment of the input wiring group 310 is connected to the horizontal programmable wiring group 100 via the rewritable nonvolatile switching element group 61. Further, each wiring segment of the input wiring group 300 is connected to the vertical programmable wiring group 200 via the rewritable nonvolatile switching element group 62. If performing programming, it is desirable to set only one rewritable nonvolatile switching element 1 at ON state. In other words, it is possible to prevent an erroneous operation of programming and to perform highly reliable and stable connection by not setting more than one rewritable nonvolatile switching element 1 which are connected to the same wiring at ON state.

Further, In FIG. 3, the output wiring 400 is connected to the horizontal programmable wiring group 100 via the rewritable nonvolatile switching element group 21. The output wiring 410 is connected to the vertical programmable wiring group 200 via the rewritable nonvolatile switching element group 22. If performing programming, it is desirable to set only one rewritable nonvolatile switching element 1 at ON state. In other words, it is possible to prevent an erroneous operation of programming and to perform highly reliable and stable connection by not setting more than one rewritable nonvolatile switching element 1 which are connected to the same wiring at ON state.

[Description of the effect] In the programmable cell 5 by disposing the rewritable nonvolatile switching element groups 62 and 22 newly, it becomes possible to connect the vertical programmable wiring group 200 to the input and output of the function block 2 directly. Thus, it is possible to increase the flexibility of wiring design and to realize high routability, as is the case with the first exemplary embodiment.

Since the rewritable nonvolatile switching element 1 has a very small area, even if the number of the elements increases, it does not affect the area of the whole circuit. On the other hand, since a programming transistor has a very large area, the number of them dominates the circuit area. Because addition of the rewritable nonvolatile switching element groups 62 and 22 do not require additional programming transistors, the area of the whole circuit hardly increases, and thus it is possible to realize high routability,

[Third Exemplary Embodiment]

Next, the third exemplary embodiment will be described.

Figure 4:
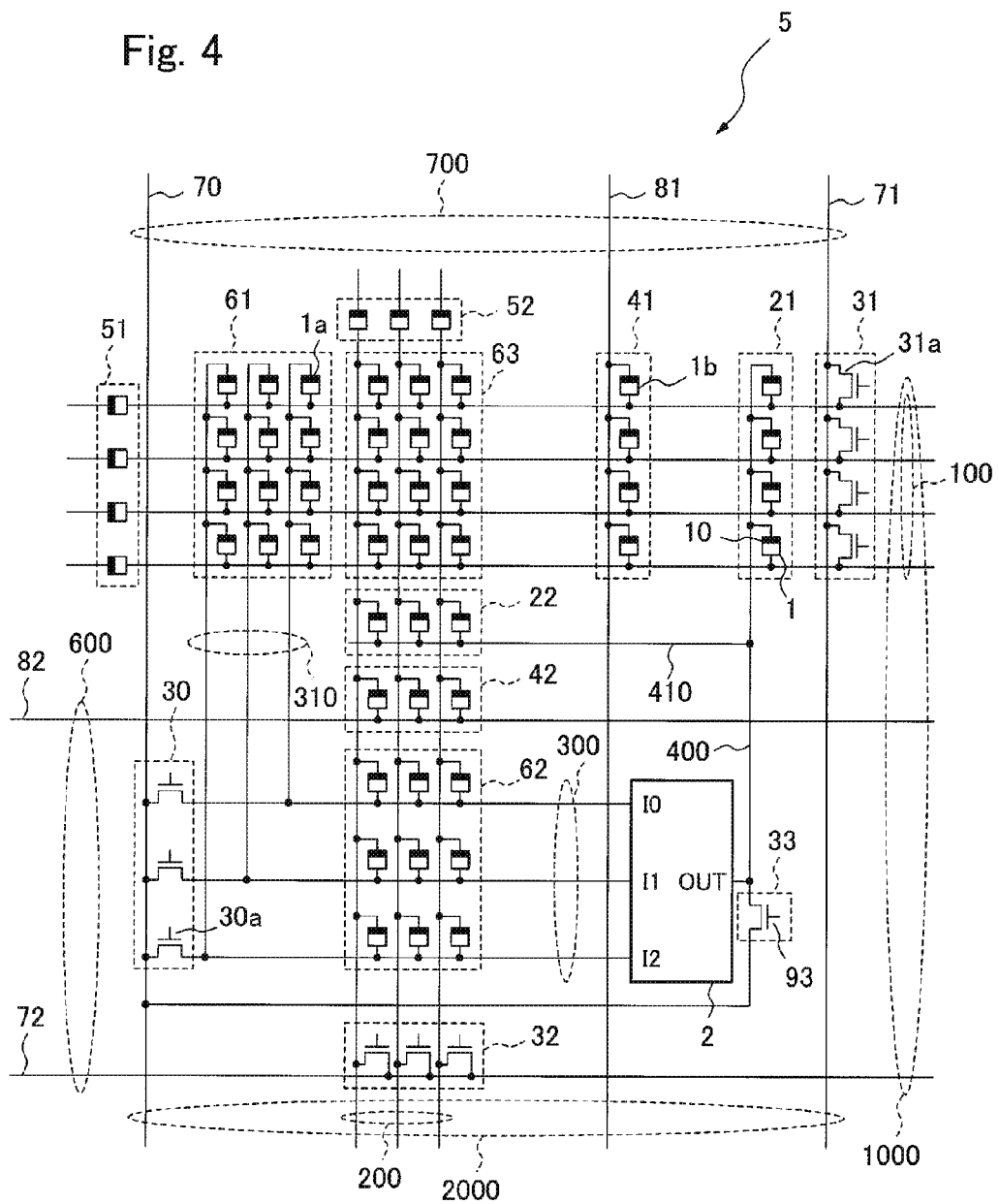
FIG. 4 is a circuit diagram of the programmable cell 5 in the third exemplary embodiment.

[Description of structure] As shown in FIG. 4, the different point of the present exemplary embodiment from the second exemplary embodiment is that rewritable nonvolatile switching element groups 41 and 42 are disposed. The other structure and connection relationship of the present exemplary embodiment are the same as those of the second exemplary embodiment.

A programmable cell 5 of the present exemplary embodiment is provided with the rewritable nonvolatile switching element group 41 in the horizontal programmable wiring group 100. The rewritable nonvolatile switching element group 41 has a function to set an unused wiring at a logical value and prevent an unused line from becoming a floating wiring by supplying a logical value of 0 or 1 to the horizontal programmable wiring group 100 from a horizontal fixed value programmable wiring 81.

The cathodes of the rewritable nonvolatile switching element group 41 are connected to each wiring of the horizontal programmable wiring group 100, respectively. The anodes 10 of the rewritable nonvolatile switching element group 41 are connected to the horizontal fixed value programming line 81.

Further, the programmable cell 5 of the present exemplary embodiment is provided with the rewritable nonvolatile switching element group 42 in the vertical programmable wiring group 200. The rewritable nonvolatile switching element group 42 has a function to set an unused line at a logical value and prevent an unused line from becoming a floating wiring by supplying a logical value of 0 or 1 to the vertical programmable wiring group 200 from a vertical fixed value programmable wiring 82.

The anodes 10 of the rewritable nonvolatile switching element group are connected to each wiring of the vertical programmable wiring group 200, respectively. The cathodes of the rewritable nonvolatile switching element group are connected to the vertical fixed value programming line 82.

[Description of the action] An example of programming of the rewritable nonvolatile switching element groups 41 and 42 will be described.

If a rewritable nonvolatile switching element 1*b* in the rewritable nonvolatile switching element group 41 is set at ON atate, a programming transistor 31*a* is turned on and the other programming transistors are turned off.

Next, if the horizontal fixed value programming line 81 is set at an ON setting voltage Von and the horizontal programming line 71 is set at 0 V, the rewritable nonvolatile switching element 1*b* becomes an ON state after the elapse of a certain period of time.

At this time, to prevent an unintended rewritable nonvolatile switching element 1 from being programmed, it is desirable to set a non-use programming wiring at half the voltage of Von for precharge. In order to change the rewritable nonvolatile switching element 1*b* into OFF state, the horizontal fixed value programming line 81 should be set at 0 V and the horizontal programming line 71 should be set at an OFF voltage V.

[Description of the Effect] Generally, there are some unused programmable wirings in a reconfigurable circuit. Without any process, an unused programmable line will be floating line whose electric potential is unfixed because of nothing to driven it. It is desirable to eliminate a floating line because it causes a problem such as increasing power consumption and the like.

Methods are known by which it becomes possible to prevent a programmable line from becoming a floating line by connecting pull-up resistor or a bus holder. However, those methods have a problem that the area and the electric power consumption enlarge and wiring delay increases.

The programmable cell 5 of the present exemplary embodiment is programmed to change the rewritable nonvolatile switching element into an ON state which is connected to an unused wiring segment among the rewritable nonvolatile switching element group 41 and the rewritable nonvolatile switching element group 42.

An unused line segment does not become a floating line because it can be fixed to a predetermined logical value, if a logical value of 0 or 1 is supplied to it from the horizontal fixed value programming line 81 and the vertical fixed value programming line 82.

In the above method, the rewritable nonvolatile switching element 1 to supply fixed value is in OFF state in the wiring segments except the rewritable nonvolatile switching element group 41 or 42. Therefore, the power consumption and the increase in delay is very small.

Also, the area of the whole circuit hardly increases because the rewritable nonvolatile switching element 1 is very small. Further, it is not necessary to add a new programming transistor even if the rewritable nonvolatile switching element groups 41 and 42 are added newly. Therefore, it is possible to realize a floating line prevention circuit on the small area.

[Fourth Exemplary Embodiment]

Next, the fourth exemplary embodiment will be described.

Figure 5:
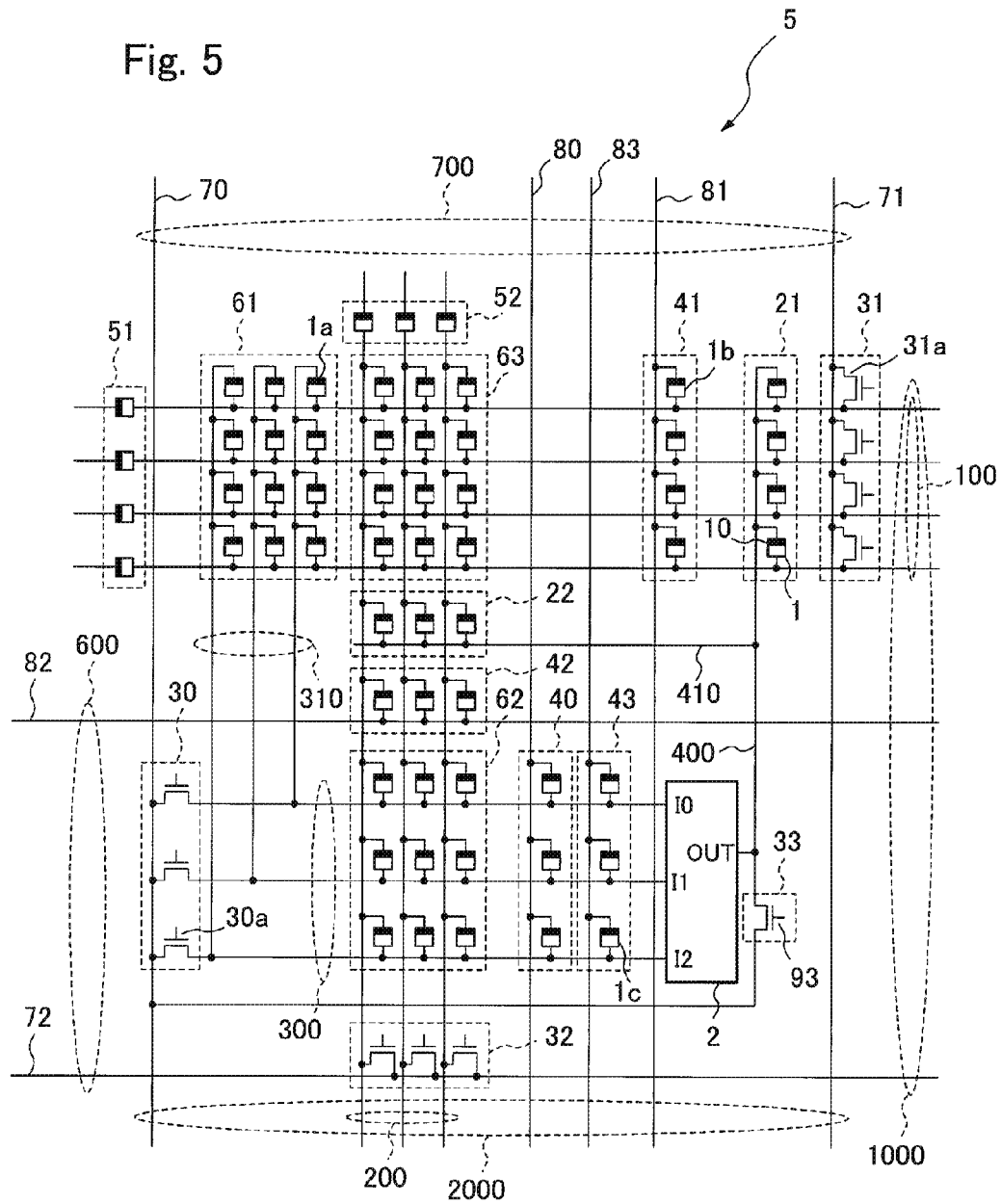
FIG. 5 is a circuit diagram of the programmable cell 5 in the fourth exemplary embodiment.

[Description of structure] As shown in FIG. 5, the different point of the present exemplary embodiment from the second exemplary embodiment is that rewritable nonvolatile switching element groups 40 and 43 are disposed. The other structure and connection relationship of the present exemplary embodiment are the same as those of the second exemplary embodiment.

The programmable cell 5 of the present exemplary embodiment is provided with the grouped rewritable nonvolatile switching element group 40 in the input line group 300. The rewritable nonvolatile switching element group 40 has the function to set a fixed logical value 0 to the input line group 300 programmably.

Also, the programmable cell 5 of the present exemplary embodiment is provided with the rewritable nonvolatile switching element group 43 in the input line group 300. The rewritable nonvolatile switching element group 43 has the function to set a fixed logical value 1 to the grouped input line group 300 programmably.

The cathode of each element the rewritable nonvolatile switching element group 40 is connected to each line of the input line group 300 respectively, and the anode 10 is connected to an input logical-value-0 programming line 80.

The rewritable nonvolatile switching element group 40 is programmed that the rewritable nonvolatile switching element 1 is into the ON state, which is associated with a line segment to be desired to set fixed logical value to 0 among the input line group 300. Then, a desired wiring segment of the grouped input line group 300 can be set to fixed logical value 0 by setting the input logical-value-0 programming line 80 at the logical value 0.

In the rewritable nonvolatile switching element group 43, the cathode of each element is connected to each line segment of the grouped input line group 300, and the anode 10 is connected to an input logical-value-1 programming line 83.

The rewritable nonvolatile switching element group 43 is programmed that the rewritable nonvolatile switching element 1 is set at the ON state, which is associated with a line segment to be desired to set fixed logical value to 1 among the input line group 300. Then, a desired line segment of the input line group 300 can be set at a fixed logical value 1 by setting the input logical-value-1 programming line 83 at the logical value 1. By the above mentioned method, it is possible to set fixed logical values 0 or 1 to an optional input of the function block 2.

[Description of the operation] An example of programming of the rewritable nonvolatile switching element group 43 will be described. If setting a rewritable nonvolatile switching element 1c in the rewritable nonvolatile switching element group 43 at ON state, only a programming transistor 30a is turned on and the other programming transistors are turned off.

If the input logical-value-1 programming line 83 is set at an ON setting voltage Von and the input programming line 70 is set at 0 V, the rewritable nonvolatile switching element 1c becomes an ON state after a the elapse of certain period of time. At this time, preventing an unintended rewritable nonvolatile switching element 1 from programming, it is desirable to set a non-use programming line at a half the voltage of Von.

In order to set the rewritable nonvolatile switching element 1c at turn-off state, the horizontal fixed value programming line 83 should be set at 0 V and the horizontal programming line 70 at an off voltage V. Programming of the rewritable nonvolatile switching element group 40 is in the same way.

Figures 6A, 6B:
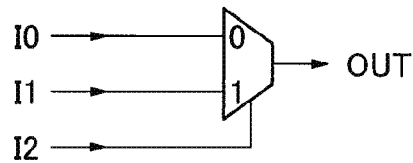
FIG. 6A is an example of the function block 2.
FIG. 6B is a table showing the function block and the logic function.

FIG. 6A is an example of the function block 2 of FIG. 2. This is a multiplexer which outputs a 0 side input I0 to OUT in case of an input I2 equal to 0 and outputs a 1 side input I1 to OUT in case of an input I2 equal to 1.

The table of FIG. 6B shows a logic functions of the multiplexer in FIG. 6A when fixed logical values at any one of 0, 1, or an optional input signal is given to input terminals I0, I1 and I2. Thus, various logic functions can be realized by giving a fixed logical value to the inputs.

[Description of the effect] Various logic functions can be set for the programmable cell 5 of the exemplary embodiment of the present invention by providing the rewritable nonvolatile switching element group 40 and the grouped rewritable nonvolatile switching element group 43. It is not necessary for the rewritable nonvolatile switching element groups 40 and 43 to provid an additional programming transistor, and so it is possible to set a fixed logical value to the input line group 300 on the small area.

While the function block indicated in FIG. 6B is as one example of function blocks, the function block would have various changes in form and details. For example, the number of inputs and outputs of the function block 2 can be changed.

Figure 7:
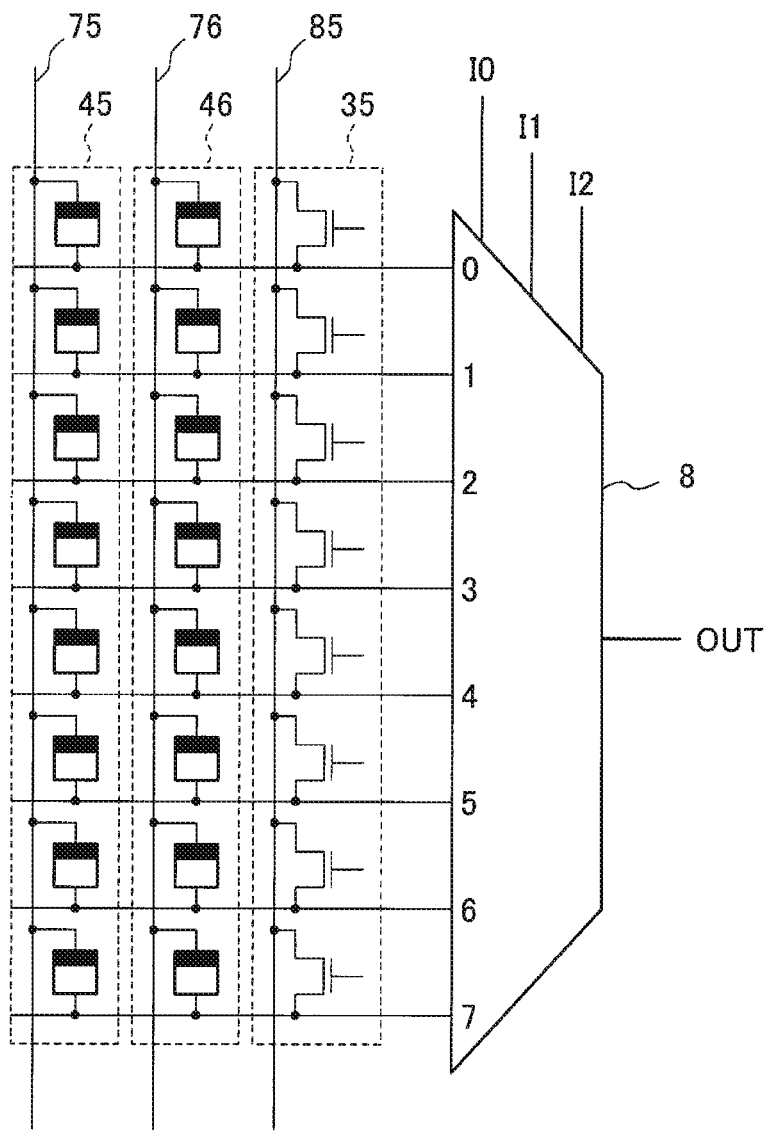
FIG. 7 is an example of the 3-input LUT using the rewritable nonvolatile switching element.

[The other effects] Generally, a look-up table (hereinafter, LUT) is widely used as the function block 2. FIG. 7 is an example of the 3-input LUT using the rewritable nonvolatile switching element 1. The LUT disposes an 8-input multiplexer 8 whose inputs from 0 to 7 are connected to the rewritable nonvolatile switching element groups 45 and 46.

In each input of the circuit described in FIG. 7, it is programmed a switching element of any one of LUT logical-value-0 rewritable nonvolatile switching element group 45 and LUT logical-value-1 rewritable nonvolatile switching element group 46 to set at ON state. After performing programming of all pieces of rewritable nonvolatile switching element 1, a LUT logical-value-0 programming line 75 is set at the logical value 0 and making a LUT logical-value-1 programming line 76 is set at the logical value 1, and then it functions as a LUT. I0, I1, and I2 become input of the function block 2, and OUT becomes output of the function block 2.

However, there is a problem that the area of a LUT using the rewritable nonvolatile switching element 1 becomes large. The reason is that LUT programming transistor group 35 and a LUT programming line 85 connected to the former are needed for the inputs of the 8-input multiplexer 8 in order to program the LUT. Because a programming transistor occupies a large area, the area of this LUT will be very large.

In the programmable cell 5 of the present exemplary embodiment, various logic functions can be set to the function block 2 by providing the rewritable nonvolatile switching element group 40 and the rewritable nonvolatile switching element group 43 for the input of the function block 2.

Also, because the input programming transistor group 30 already having been provided can be used for programming of the rewritable nonvolatile switching element 1, addition of a programming transistor is not necessary. Thus, the present exemplary embodiment can realize a logic function setting means of a small area using the rewritable nonvolatile switching element 1.

[Fifth Exemplary Embodiment]

Next, the fifth exemplary embodiment will be described.

Figure 8:
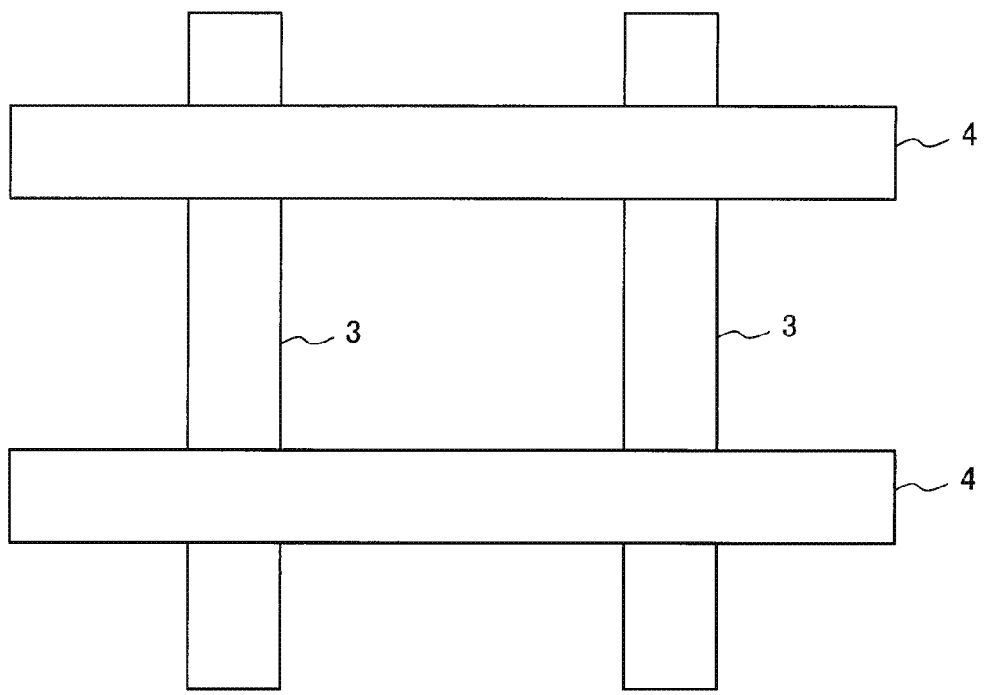
FIG. 8 is a top view of the wiring layout.

As shown in FIG. 8, the different point of the present exemplary embodiment from the second exemplary embodiment is that a line in the vertical direction is formed onto a M-th layer metal wiring 3 and a line in the horizontal direction is formed onto an M+1-th layer metal wiring 4. Structure and connection relationship of the present exemplary embodiment are the same as those of the second exemplary embodiment except lines and blocks listed above.

The programmable cell 5 of the present exemplary embodiment uses the rewritable nonvolatile switching element 1.

For example, as shown in from FIG. 3 to FIG. 5, the rewritable nonvolatile switching element groups 61 and 62 form two-dimensional switch matrices, moreover both of them form different two-dimensional switch matrices with the rewritable nonvolatile switching element group 63. Thus, not only a simple single switch matrix but plural switch matrices existing in association with each other complicatedly are included on a reconfigurable circuit in the present exemplary embodiment. Therefore, it is need to have an idea to lay out switching element groups compactly.

Here, wiring of the vertical direction is formed onto the M-th layer metal wiring 3 and wiring of the horizontal direction onto the M+1-th layer metal wiring 4 in the programmable cell 5 in the present exemplary embodiment, thus a wiring direction is changed for each layer alternately.

FIG. 8 is a diagram of the top view about a wiring layout sample. Here, the M-th layer metal wiring 3 is used for a vertical direction wiring and the M+1-th layer metal wiring 4 is used for a horizontal direction wiring. The rewritable nonvolatile switching element 1 is formed into an intersection of the horizontal direction wiring 4 and the vertical direction wiring 3.

Figure 9:
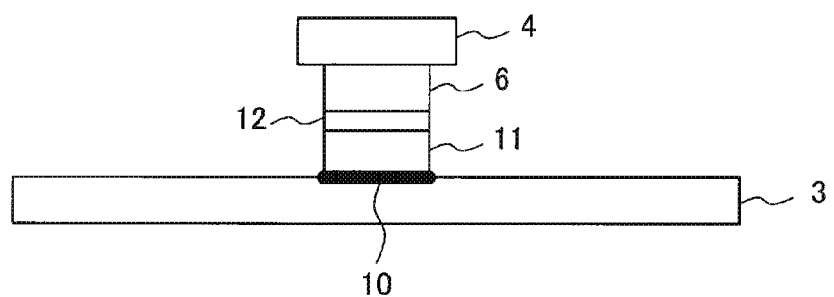
FIG. 9 is a side view of the rewritable nonvolatile switching element at the intersecting point of wirings.

FIG. 9 is a diagram of the side view about an intersection of the vertical wiring direction 3 and the horizontal wiring direction 4. The rewritable nonvolatile switching element 1 including the anode 10, the ion conductor 11, and the cathode 12 is formed between the vertical direction wiring 3 and the horizontal direction wiring 4. A via 6 connects the horizontal direction wiring 4 and the rewritable nonvolatile switching element 1. Because the anode 10 is often made of copper in the same material as a wiring, the vertical direction wiring 3 can be used as the anode 10.

It is possible to suppress the cost by making the mask pattern simple, if forming all pieces of rewritable nonvolatile switching element 1 in a same structure. Actually, the anode 10 of every rewritable nonvolatile switching element 1 is made to be in the vertical direction wiring 3 side of M-th layer and the cathode 12 is made to be in the horizontal direction wiring 4 side of M+1-th layer as an example using FIG. 9. In addition, it would be fair to reverse the directions of all pieces of rewritable nonvolatile switching element 1.

Figure 10A:
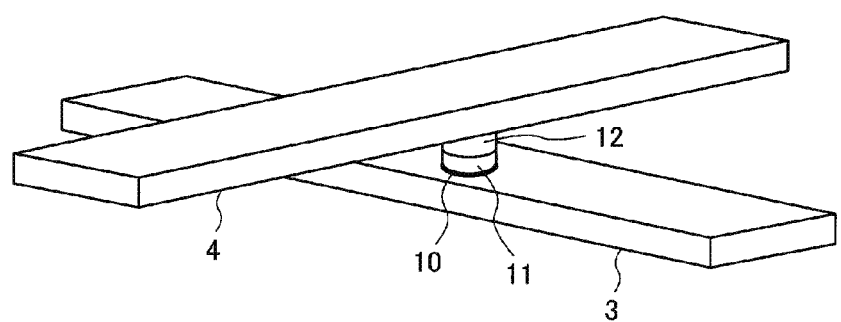
FIG. 10A is a perspective view of the rewritable nonvolatile switching element.

FIG. 10A is a perspective view of FIG. 9. The rewritable nonvolatile switching element 1 is formed between the horizontal direction wiring 4 and the vertical direction wiring 3. The anode 10 is formed in the side of the vertical direction wiring 3.

[Description of the effect] while plural switch matrices exist in association with each other complicatedly in the programmable cell 5 of the present exemplary embodiment, every rewritable nonvolatile switching element 1 is formed in the same direction. For example, wasteful pulling over of wiring can be eliminated as a whole and a compact layout can be made, by connecting the anode 10 of every rewritable nonvolatile switching element 1 to M-th layer vertical direction metal wiring and connecting the cathode to M+1-th layer horizontal direction metal wiring. In this regard, however, the rewritable nonvolatile switching element 1 outside of an intersection of wiring of the vertical direction and the horizontal direction such as ones in the rewritable nonvolatile switching element groups 51 and 52 are not available.

Figure 10B:
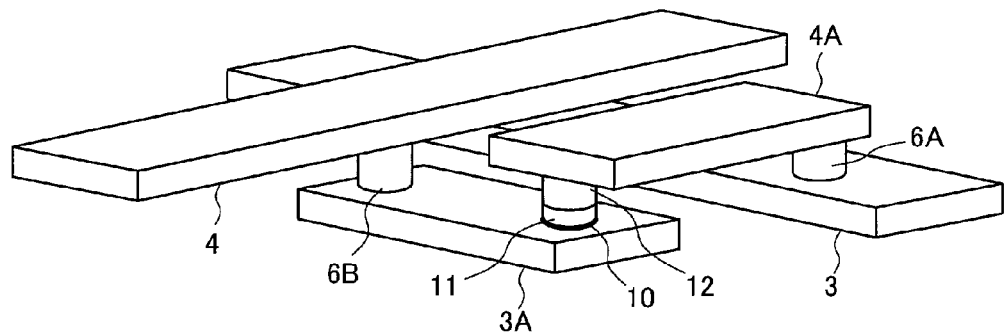
FIG. 10B is a perspective view of the rewritable nonvolatile switching element.

As shown in FIG. 10B, wiring connected to anode 10 and wiring connected to the cathode 12 can be made reverse while keeping the direction of the rewritable nonvolatile switching element 1 the same. FIG. 10B is a perspective view in which wiring is reversed compared with FIG. 10A. That is to say, the anode 10 is connected to the horizontal direction wiring 4 and the cathode 12 is connected to the vertical direction wiring 3.

Referring to this structure in detail, the anode 10 of the rewritable nonvolatile switching element 1 is connected to a M-th layer metal wiring 3A. Further, the M-th layer metal wiring 3A is connected to the horizontal direction wiring 4 via a via 6B. The cathode of the rewritable nonvolatile switching element 1 is connected to a M+1-th layer metal wiring 4A. Further, the M+1-th layer metal wiring 4A is connected to the vertical direction wiring 3 via a via 6A.

Thus, the anode 10 and the cathode of the rewritable nonvolatile switching element 1 can be connected to opposite wiring of the example of FIG. 10A.

[Sixth Exemplary Embodiment]

Next, the sixth exemplary embodiment will be described.

Figure 11:
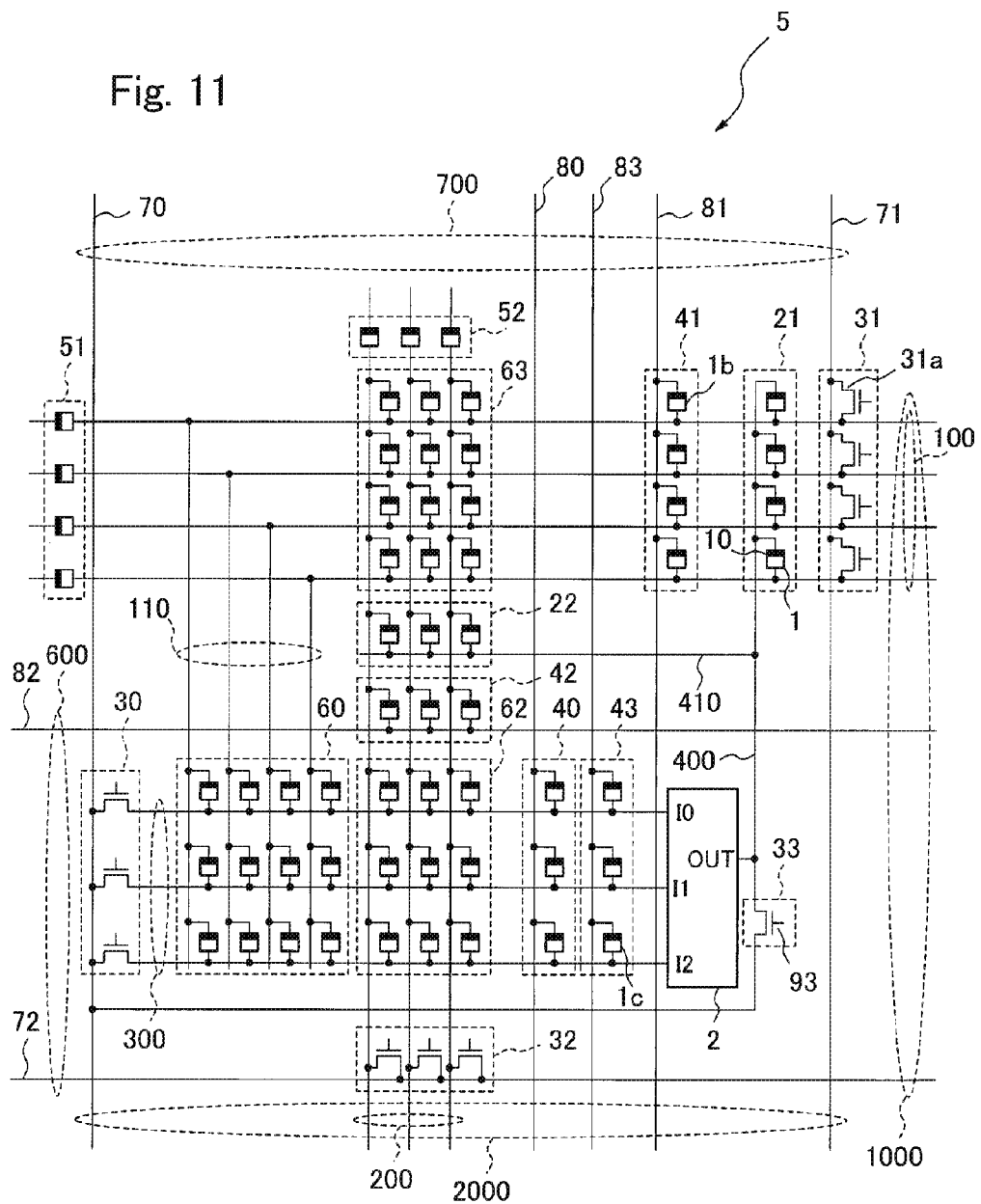
FIG. 11 is a circuit diagram of the programmable cell 5 in the sixth exemplary embodiment.

As shown in FIG. 11, the different point of the present exemplary embodiment from the second exemplary embodiment is that the rewritable nonvolatile switching element group 61 is different from the place and is renamed the rewritable nonvolatile switching element group 60. Structure and connection relationship of the present exemplary embodiment are the same as those of the second exemplary embodiment except lines and blocks listed above.

As shown in FIG. 11, a reconfigurable circuit in the present exemplary embodiment includes vertical direction branch lines 110 for the of horizontal direction programmable wiring group 100, and the vertical direction branch line group 110 connect to the input line group 300 via the rewritable nonvolatile switching element 60. In other words, in FIG. 11, the rewritable nonvolatile switching element group 61 indicated in FIG. 2 is different from the place and is renamed the rewritable nonvolatile switching element group 60.

In the case of this structure, while the topology of the circuit is not changed, polarity of the rewritable nonvolatile switching element group 60 become reverse to the rewritable nonvolatile switching element group 61 in FIG. 2, because it follows the above-mentioned optimum layout.

That is to say, the anode 10 of the rewritable nonvolatile switching element group 60 is connected to the vertical direction branch line group 110 of the horizontal direction programmable wiring group 100. On the other hand, the cathode of the rewritable nonvolatile switching element group 61 of FIG. 2 is connected to the horizontal direction programmable wiring group 100.

In both of FIG. 2 and FIG. 8, long-distance lines of the vertical direction and the horizontal direction correspond to vertical direction wiring group and horizontal direction wiring group of an actual layout, respectively. Conforming to the rewritable nonvolatile switching element groups 60 and 61 described above to the compact layout method, such handling is needed. As above, a circuit diagram net list can be determined so that an optimum layout can be realized in the present exemplary embodiment.

[Description of the effect] In every rewritable nonvolatile switching element 1 (except for the rewritable nonvolatile switching element groups 51 and 52) of FIG. 11, the anode 10 is connected to the vertical direction wiring side. Thus, it is possible to design connecting and reversing the rewritable nonvolatile switching element 1 in a circuit diagram according to a layout and it becomes possible to realize various kinds of wiring design.

[Seventh Exemplary Embodiment]

Next, the seventh exemplary embodiment will be described.

Figure 12:
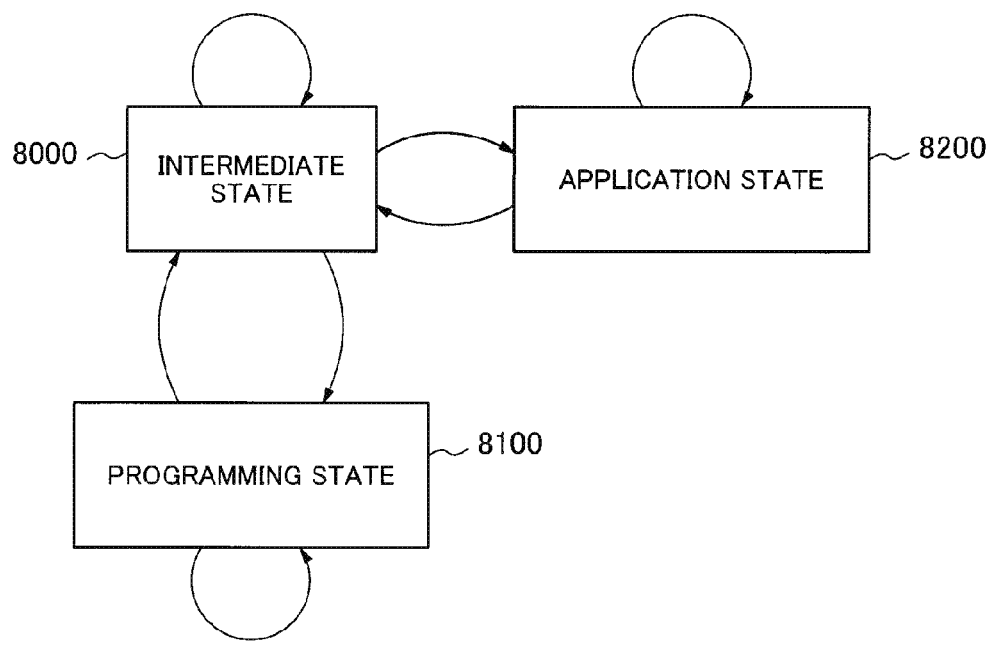
FIG. 12 is a state transition diagram of the reconfigurable circuit in the seventh exemplary embodiment.
Figure 16:
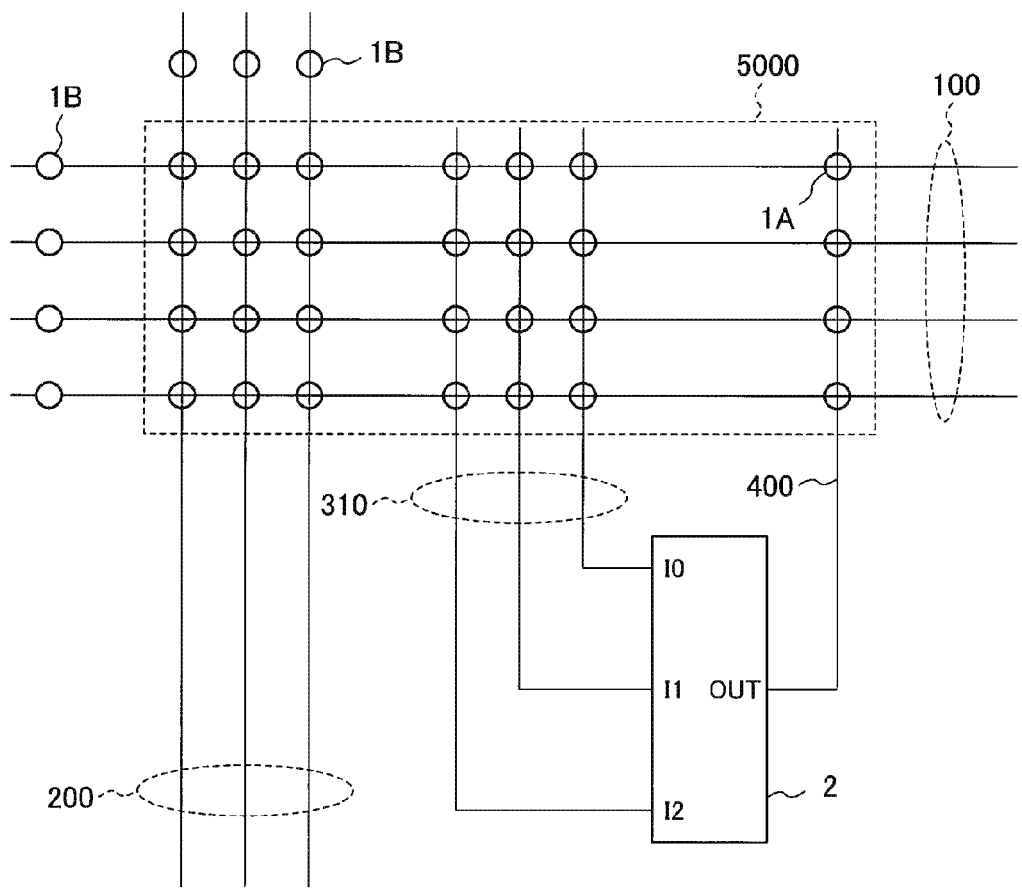
FIG. 16 is a circuit diagram of the programmable cell 5 described in the patent literature 1.
Figure 17A:
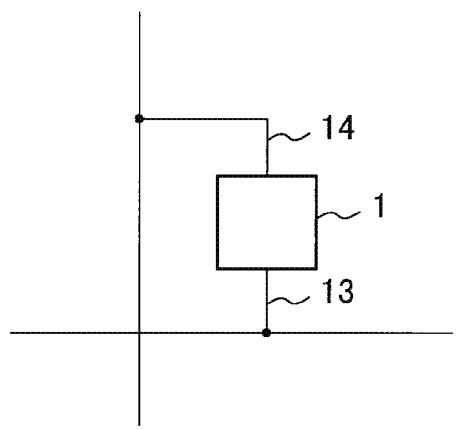
FIG. 17A shows a rewritable nonvolatile switching element arranged between cross wirings.
Figure 17B:
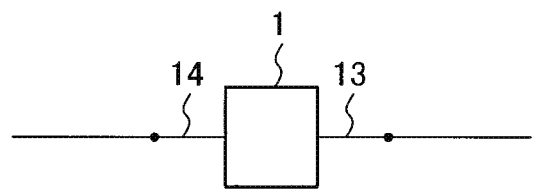
FIG. 17B shows a rewritable nonvolatile switching element between parallel wirings.

As shown in FIG. 12, a reconfigurable circuit of the present exemplary embodiment has an operation mode with transition among three states. Structure and connection relationship of the present exemplary embodiment are the same as those of the first exemplary embodiment except lines and blocks listed above.

FIG. 12 indicates a state transition diagram of a reconfigurable circuit in the present exemplary embodiment. A reconfigurable circuit in the present exemplary embodiment makes transition among three states, such as an intermediate state 8000, a programming state 8100, and an application state 8200.

A reconfigurable circuit in the present exemplary embodiment will be in the intermediate state 8000, if it is powered on in the state that a configuration has not been performed yet. At that time, every programming transistor becomes off state, and every programming driver 7 outputs an intermediate voltage Vmdl. As a result, every line will be set at the intermediate voltage Vmdl and a floating line disappears.

In a case where one specific rewritable nonvolatile switching element 1 is programmed, transition to the programming state 8100 is made. The programming state 8100 turns on a programming transistor connected to the rewritable nonvolatile switching element 1 of a programming target and turns off programming transistors besides that.

In this case, the programming driver 7, connected to the anode 10 of the rewritable nonvolatile switching element 1 of the programming target, outputs a voltage Von and another programming driver 7, connected to the cathode 12 of it, outputs zero voltage and thus programming of the switching element into the ON state is made.

Every time a programming of one piece of rewritable nonvolatile switching element 1 is completed, it returns to the intermediate state 8000 and advances towards programming of a different switching element again.

[Description of the effect] In the programming state 8100, almost every line of a reconfigurable circuit becomes a floating line. However, because it returns to the intermediate state 8000 every time the program of one switching element is ended, it is possible to charge all lines to the intermediate voltage Vmdl and keep the electric potential within a certain range.

After desired programs have ended, transition to the application state 8200 is made. Here, all power supply voltages are set to a normal operation voltage Vdd, and an application circuit which has been written into the reconfigurable circuit by the programming can be operated.

When programmed once, it does not disappear even if the power supply is cut. Therefore, next time the power is turned on again and the application circuit is driven, it can be started from the application state 8200 directly.

In the case where the application circuit is rewritten, transition to the intermediate state 8000 is made, and a desired rewritable nonvolatile switching element 1 is set at ON state or OFF state. When performing OFF state setting, transition to the programming state 8100 is made, the output voltage of the programming driver 7 connected to the cathode of a rewritable nonvolatile switching element 1 of the program target is set to Voff, and the output voltage of a programming driver 7 connected to the anode 10 to 0 V.

[Eighth Exemplary Embodiment]

Next, the eighth exemplary embodiment will be described.

Next, a programming block in a reconfigurable circuit of the present exemplary embodiment will be described. Structure and connection relationship of the present exemplary embodiment are the same as those of the second exemplary embodiment except lines and blocks listed above.

[Description of the structure] FIG. 13A is a block diagram of the first programming block 7000 in FIG. 2. The first programming block 7000 includes programming drivers 7a, 7b, 7A, 7B, and 7C, and the TEST terminal of each programming driver 7 is connected to the state detection line 500.

Each output PV of the programming drivers 7a, 7b, 7c, 7A, 7B, and 7C drives the input programming line 70, the horizontal programming line 71, the input logical-value-0 programming line 80, the input logical-value-1 programming line 83, and the horizontal fixed value programming line 81, respectively.

FIG. 13B is diagram indicating a block diagram of the second programming block 6000 in FIG. 2. The second programming block 6000 includes programming drivers 7d and 7D, and the TEST terminal of each programming driver 7 is connected to the state detection line 500.

Each output PV of programming driver 7d and 7D drives the vertical fixed value programming line 82 and the vertical programming line 72, respectively.

The first programming line group 700 of FIG. 2 corresponds to the programming line groups 70, 71, 80, 83, and 81 of FIG. 5. The second programming line group 600 of FIG. 2 corresponds to the programming line groups 72 and 82 of FIG. 5.

Next, a circuit diagram of each programming driver 7 will be described using FIG. 14.

The programming driver 7 selects one from at least three kinds of power supply voltages such as Von, Voff, Vmdl, and a ground 0 V and outputs it to PV. Or, the whole voltage selection transistor group 36 is turned off, it is to be made for the PV in the high impedance state.

Which of these states is outputted by a programming driver 7 is decided by the signal given to voltage selection line group 96. This signal is based on a signal outputted from the programming controller 9 of FIG. 2. In other words, which of the voltages is outputted is decided by the programming controller 9.

When the voltage outputted to PV is 0 V, a test selection transistor 34 is turned on, and the voltage of PV is outputted to a TEST terminal. In order to program only one rewritable nonvolatile switching element 1 at a time, only one among all pieces of programming driver 7 outputs 0 V.

That is, only one TEST terminal is enabled, and the other TEST terminals will be in the high impedance state (a TEST selection transistor becomes off). Because the resistance of the rewritable nonvolatile switching element 1 differs greatly between the ON state and the OFF state, electric potentials of the terminal PV of a programming driver 7, which outputs 0 V, are also different between them.

That is to say, although it is approximately 0 V in the OFF state, it becomes of an electric potential more definitely higher than that in the ON state. The difference in these electric potentials is transmitted to the programming controller 9 from the TEST terminal through the state detection line 500. By this, the programming controller 9 detects whether desired programming has been performed or not.

Further, because a voltage is applied to the rewritable nonvolatile switching element 1 via a programming transistor, a voltage that is lower than the original voltage by the programming transistor threshold voltage Vth of the programming transistor is added. Therefore, the voltages Von and Voff given from outside should be given a voltage of Vth higher than the ON voltage and the OFF voltage of the rewritable nonvolatile switching element 1.

In the intermediate state 8000, a half of the ON voltage is given to the rewritable nonvolatile switching element 1. Therefore, it is desirable to make the external source voltage Vmdl be sum of the half of ON voltage and the half of Vth. In general, Von is higher than Voff, and the both voltages are different from each other. In addition, the OFF current for programming the rewritable nonvolatile switching element 1 to the OFF state is larger than the ON current for programming it to the ON state.

Thus, regarding the ON setting and OFF setting, not only polarities of voltages applied to the rewritable nonvolatile switching element 1 are reversed from each other, but also voltage values and current values are different from each other. The programming driver 7 of FIG. 14 can apply three different kind voltages, and can set an electric current optionally for each power supply by adjusting each transistor width of the grouped voltage selection transistor group 36.

An example is indicated in the programmable cell 5 of FIG. 2, in which the horizontal programmable line group 100 includes four wiring segment, the vertical programmable line group 200 includes three wiring segments, the number of inputs of the function block 2 is three, and the number of outputs of the function block 2 is one and these numbers may be optional. While an example is shown, in which the length of each line segment is equal to that of one programmable cell 5, the wiring length is not limited to this.

[Description of the effect] There is a problem that a reconfigurable circuit using the rewritable nonvolatile switching element 1 can use only one kind programming voltage generally. In other words, it is assumed that voltages of the ON setting and the OFF setting of the rewritable nonvolatile switching element 1 are the same while their polarities are reversed from each other. However, Von and Voff are not necessarily the same generally, and thus an ON setting current and an OFF setting current are often times different. Further, because a state besides the ON setting and the OFF setting is also needed in the programming process, there is a problem that handling of various kinds of programming state 8100 is not possible.

A reconfigurable circuit using the rewritable nonvolatile switching element 1 in the present exemplary embodiment includes a function to output an ON setting voltage and an OFF setting voltage of the rewritable nonvolatile switching element 1, an intermediate voltage, and 0 V to the programming driver 7. Also, regarding the above output voltages, an electric current can be set for each power supply by an adjustment of a transistor width.

By the aforementioned configurations, appropriate ON setting conditions and OFF setting conditions can be realized and reliable programming of the rewritable nonvolatile switching element 1 can be performed. Further, by having the intermediate voltage output function, erroneous programming of the rewritable nonvolatile switching element 1 can be suppressed because a programmable line can be held within a desired potential range.

While the programmable wiring groups 100 and 200 intersect with each other perpendicularly in the above-mentioned first to eighth exemplary embodiments, it is not limited to this angle and it may be intersection at any angle.

While the invention has been particularly shown and described with reference to exemplary embodiments thereof. The invention is not limited to these embodiments. It will be understood by those of ordinary skill in the art that various changes in form and details may be made therein without departing from the spirit and scope of the present invention as defined by the claims.

This application is based upon and claims the benefit of priority from Japanese Patent Application No. 2010-200433, filed on Sep. 8, 2010, the disclosure of which is incorporated hereby in its entirety by reference.

DESCRIPTION OF THE CODES 1, 1A, 1B, 1a, 1b, 1c, 40, 41, 42, 43, 45 and 46 Rewritable nonvolatile switching element
2 Function block
3 and 3A M-th layer metal wiring
4 and 4A M+1-th layer metal wiring
5 Programmable cell
6, 6A and 6B Via
7a, 7b, 7d, 7A, 7B, 7C and 7D Programming driver
8 8-input multiplexer
9 Programming controller
10 Anode
11 Ion conductor
12 Cathode
13 and 14 Terminal of the rewritable nonvolatile switching element 1
21, 22, 40, 41, 42, 43, 51, 52, 60, 61, 62 and 63 Rewritable nonvolatile switching element group
30 Input programming transistor group
31 Horizontal programming transistor group
32 Vertical programming transistor group
33 Output programming transistor
30a and 31a Programming transistor
34 Test selection transistor
35 LUT programming transistor group
36 Voltage selection transistor group
70 Input programming line
71 Horizontal programming line
72 Vertical programming line
75 LUT logical-value-0 programming line
76 LUT logical-value-1 programming line
80 Input logical-value-0 programming line
81 Horizontal fixed value programming line
82 Vertical fixed value programming line
83 Input logical-value-1 programming line
85 LUT programming line
93 Gate terminal of the output programming transistor 33
96 Voltage selection line group
100 Horizontal programmable wiring group
110 Vertical direction branch lines
200 Vertical programmable wiring group
300 and 310 Input line group of the function block 2
400 and 410 Output line of the function block 2
500 State detection line
600 Second programming line group
700 First programming line group
1000 Horizontal line group
2000 Vertical line group
5000 Intersecting area
6000 Second programming block
7000 First programming block
8000 Intermediate state
8100 Programming state
8200 Application state

What is claimed is:

1. A reconfigurable circuit, comprising:
a first programmable wiring group disposed in a first direction;
a second programmable wiring group disposed in a second direction intersecting the first direction;
a first switching element array connecting the first programmable wiring group to branch line group of input line group of a function block at those intersecting points, or connecting branch line group of the first programmable wiring group to the input line group of the function block at those intersecting points;
a second switching element array connecting the first programmable wiring group to the output wiring of the function block at those intersecting points;
a third switching element array connecting the first programmable wiring group to the second programmable wiring group at those intersecting points;
at least one of a fourth switching element array and a fifth switching element is disposed; and wherein
the fourth switching element array connects the second programmable wiring group to the input wiring group of the function block at those intersecting points, and
the fifth switching element array connects the second programmable wiring group to the branch line of the output wiring of the function block at those intersecting points.

2. The reconfigurable circuit according to claim 1, wherein the first programmable wiring group, the input wiring group of the function block, and the branch line of the output line of the function block are formed by a first direction metal wiring disposed in a M-th layer, and wherein
the second programmable wiring group, the branch line group of the input line group of the function block, the branch line group of the first programmable wiring group, and the output line of the function block are formed by a second direction metal wiring disposed in a N-th layer, the second direction metal wiring intersecting the first direction metal wiring, and M and N being natural numbers with a difference between them equal to 1.

3. The reconfigurable circuit according to claim 2, further comprising
a first fixed value programming line formed by the second direction metal wiring; and
a second fixed value programming line formed by the first direction metal wiring, wherein
an intersecting point of the first fixed value programming line and the first programmable wiring group is connected by a sixth switching element array, and
an intersecting point of the second fixed value programming line and the second programmable wiring group is connected by a seventh switching element array.

4. The reconfigurable circuit according to claim 2, wherein the switching element is a rewritable nonvolatile switching element comprising an ion conductor sandwiched by an anode and a cathode and formed with the same polarity between the first direction metal wiring disposed in the M-th layer and the second direction metal wiring disposed in the N-th layer.

5. The reconfigurable circuit according to claim 1, further comprising first and second input fixed value programming lines, wherein an eighth switching element array connects the first and second input fixed value programming lines to the input wiring group of the function block at those intersecting points.

6. The reconfigurable circuit according to claim 1, further comprising a first programming transistor connected to the first programmable wiring group by a drain terminal thereof;
a first programming line connected to a source terminal of the first programming transistor;
a second programming transistor connected to the second programmable wiring group by a drain terminal thereof;
a second programming line connected to a source terminal of the second programming transistor;
an input programming transistor connected to the input wiring group of the function block by a drain terminal thereof; and
an input programming line connected to a source terminal of the input programming transistor.

7. The reconfigurable circuit according to claim 6, wherein
a programming terminal of a programming driver is connected to each programming line, wherein
the programming terminal is able to select one of states of
a first power supply voltage setting the switching element to a conduction state;
a second power supply voltage setting the switching element to a cut off state;
a third voltage larger than a half of the first power supply voltage by a half of a threshold voltage of the programming transistor;
a ground voltage; and
a high impedance, and
each programming terminal is controlled by a signal outputted from a programming controller.

8. The reconfigurable circuit according to claim 7, wherein
the programming driver comprises a voltage selection transistor selecting one of the first to third power supply voltages and the ground voltage, and
a width of the voltage selection transistor for selecting the first power supply voltage is smaller than a width of the voltage selection transistor for selecting the second power supply voltage.

9. The reconfigurable circuit according to claim 8, wherein
a source terminal of a test selection transistor is connected to the programming terminal of each programming driver,
a drain terminal of the test selection transistor is connected to a state detection line,
the state detection line is inputted into the programming controller, and
the test selection transistor of a programming driver concerned in programming of the switching element among the programming drivers transmits a source voltage to a drain terminal.

10. The reconfigurable circuit according to claim 8, wherein
the test selection transistor of a programming driver with the programming terminal being set at a ground voltage among the programming drivers transmits a source voltage to a drain terminal.

* * * * *